(12) United States Patent
Jing

(10) Patent No.: US 10,486,404 B2
(45) Date of Patent: Nov. 26, 2019

(54) LAMINATION DEVICE AND LAMINATION METHOD

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Yangkun Jing, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/511,119

(22) PCT Filed: Apr. 21, 2016

(86) PCT No.: PCT/CN2016/079832
§ 371 (c)(1),
(2) Date: Mar. 14, 2017

(87) PCT Pub. No.: WO2016/177286
PCT Pub. Date: Nov. 10, 2016

(65) Prior Publication Data
US 2018/0050528 A1  Feb. 22, 2018

(30) Foreign Application Priority Data

May 6, 2015  (CN) .......................... 2015 1 0227561

(51) Int. Cl.
*B32B 37/00* (2006.01)
*B32B 37/10* (2006.01)
(Continued)

(52) U.S. Cl.
CPC ............ *B32B 37/0053* (2013.01); *B32B 7/12* (2013.01); *B32B 37/003* (2013.01); *B32B 37/10* (2013.01);
(Continued)

(58) Field of Classification Search
CPC ... B32B 37/003; B32B 37/0053; B32B 37/10; B32B 37/12; B32B 37/1284;
(Continued)

(56) References Cited

U.S. PATENT DOCUMENTS

| 3,360,978 A | 1/1968 | Shinn |
| 2012/0090786 A1* | 4/2012 | Jeong .................. B32B 38/1833 156/350 |
| 2016/0001521 A1* | 1/2016 | Tanaka .................. B32B 37/003 428/177 |

FOREIGN PATENT DOCUMENTS

| CN | 1738725 A | 2/2006 |
| CN | 202053643 U | 11/2011 |

(Continued)

OTHER PUBLICATIONS

Translation of CN 103698941, Hefei BOE Optopelectronics Technolgoy Co., Ltd; BO, Jing Yangkun, Apr. 2, 2014 (Year: 2014).*
(Continued)

*Primary Examiner* — George R Koch
(74) *Attorney, Agent, or Firm* — Brooks Kushman P.C.

(57) ABSTRACT

A lamination device and a lamination method for attaching a film layer onto a substrate are provided. The lamination device includes a platform configured to carry and deliver a substrate, a layer application member configured to apply the film layer onto a surface of the substrate, a first roller configured to roll on the substrate having the film layer to perform a smoothing and bubble-removing operation, a deformable layer arranged on the first roller and capable of (Continued)

being deformed to change a rolling dot pattern at an outer circumferential surface of the first roller, thereby to enable the rolling dot pattern to match the surface of the substrate, and an alignment mechanism configured to align the substrate with the first roller.

16 Claims, 2 Drawing Sheets

(51) Int. Cl.
      *H01L 21/67*     (2006.01)
      *H01L 21/68*     (2006.01)
      *B32B 38/18*      (2006.01)
      *B32B 38/00*      (2006.01)
      *B32B 7/12*       (2006.01)
      *H01L 51/00*     (2006.01)
      *H01L 51/56*     (2006.01)
      H01L 27/32     (2006.01)
      B32B 37/12     (2006.01)

(52) U.S. Cl.
    CPC .... *B32B 38/1833* (2013.01); *H01L 21/67288* (2013.01); *H01L 21/681* (2013.01); *H01L 51/0024* (2013.01); *H01L 51/56* (2013.01); *B32B 37/1284* (2013.01); *B32B 2038/0064* (2013.01); *B32B 2457/206* (2013.01); *H01L 27/3244* (2013.01); *H01L 2227/323* (2013.01)

(58) Field of Classification Search
    CPC ........ B32B 38/1833; B32B 2038/0064; B32B 2457/206; H01L 21/67288; H01L 21/681; H01L 222/323; H01L 27/3244; H01L 51/0024; H01L 51/56
    See application file for complete search history.

(56) References Cited

FOREIGN PATENT DOCUMENTS

| | | |
|---|---|---|
| CN | 103698941 A | 4/2014 |
| CN | 103728778 A | 4/2014 |
| CN | 203818701 U | 9/2014 |
| CN | 104339808 A | 2/2015 |
| CN | 104760395 A | 7/2015 |
| JP | 2003118003 A | 4/2003 |

OTHER PUBLICATIONS

International Search Report and Written Opinion for Application No. PCT/CN2016/079832, dated Jul. 29, 2016, 13 Pages.

\* cited by examiner

LAMINATION DEVICE AND LAMINATION METHOD

CROSS-REFERENCE TO RELATED APPLICATIONS

This application is the U.S. national phase of PCT Application No. PCT/CN2016/079832 filed on Apr. 21, 2016, which claims priority to Chinese Patent Application No. 201510227561.X filed on May 6, 2015, the disclosures of which are incorporated in their entirety by reference herein.

TECHNICAL FIELD

The present disclosure relates to a substrate manufacturing device, in particular to a lamination device and a lamination method.

BACKGROUND

An AMOLED (active-matrix organic light-emitting diode) has such advantages as a wide viewing angle, a high resolution, high brightness, a rapid response speed, low power consumption, self-luminousness and ultra thinness, and is known as the third generation display technology revolution.

Usually, the substrate of an AMOLED display panel is formed by attach an AMOLED layer onto a to-be-laminated substrate through an AMOLED lamination device. The AMOLED lamination device mainly includes: a platform configured to carry and deliver the to-be-laminated substrate; a uniform-pressure roller arranged above the platform; a glue application roller configured to apply an adhesive layer onto the substrate; and a layer application member configured to apply the AMOLED layer onto a surface of the substrate having the adhesive layer. The glue application roller rolls on the to-be-laminated substrate, so as to transfer the adhesive layer onto the to-be-laminated substrate. The AMOLED layer is applied by the layer application member onto the substrate having the adhesive layer. After a smoothing and bubble-removing operation on the substrate having the AMOLED layer through the uniform-pressure roller, it is possible to attach the AMOLED layer onto the substrate.

However, there is the following drawback for the AMOLED lamination device. A surface of the to-be-laminated substrate has non-uniform flatness in individual regions, so after the AMOLED layer is applied onto the substrate having the adhesive layer and the uniform-pressure roller rolls on the AMOLED layer, bubbles may occur due to uneven pressures between the uniform-pressure roller and the surface of the substrate, and thereby the lamination effect may be adversely affected.

SUMMARY

An objective of the present disclosure is to provide a lamination device and a lamination method, so as to reduce the occurrence of bubbles and improve the lamination effect.

The present disclosure provides a lamination device for attaching a film layer onto a substrate. The lamination device includes: a platform configured to carry and deliver the substrate; a layer application member configured to apply the film layer onto a surface of the substrate; a first roller configured to roll on the substrate having the film layer to perform a smoothing and bubble-removing operation; a deformable layer arranged on the first roller and capable of being deformed to change a rolling dot pattern at an outer circumferential surface of the first roller and thereby to enable the rolling dot pattern to match the surface of the substrate; and an alignment mechanism configured to align the substrate with the first roller.

In a possible embodiment of the present disclosure, the lamination device further includes an acquisition unit configured to acquire flatness information about the surface of the substrate and control the deformable layer to be deformed based on the flatness information.

In a possible embodiment of the present disclosure, the acquisition unit includes: a second roller configured to roll on the surface of the substrate prior to applying the film layer onto the substrate; a pressure detection film arranged on an outer circumferential surface of the second roller, and configured to detect, when the second roller rolls on the surface of the substrate, a pressure between the second roller and the surface of the substrate, and generate a corresponding detection signal; and a first control module configured to generate the flatness information based on the detection signal.

In a possible embodiment of the present disclosure, the pressure detection film includes: a first electrode arranged at the outer circumferential surface of the second roller; a second electrode arranged opposite to the first electrode and overlapping the first electrode at a plurality of predetermined regions; and a plurality of capacitive sensors arranged at the predetermined regions between the first electrode and the second electrode and configured to convert, when the second roller rolls on the surface of the substrate, the pressure between the second roller and the surface of the substrate at the corresponding predetermined region into a capacitance change value, and generate the corresponding detection signal. The first control module is further configured to generate the flatness information based on the detection signal and position information about the predetermined region where the capacitive sensor is located.

In a possible embodiment of the present disclosure, the first electrode includes a plurality of first electrode strips arranged circumferentially at intervals around the second roller, the second electrode includes a plurality of second electrode strips perpendicularly intersecting the plurality of first electrode strips, and a plurality of regions where the first electrode strips intersect the second electrode strips form the plurality of predetermined regions.

In a possible embodiment of the present disclosure, the deformable layer includes a piezoelectric deformable layer which is deformed under the effect of an applied voltage, and an electrode structure configured to apply a voltage signal to the piezoelectric deformable layer. The acquisition unit includes a second control module configured to transmit a first voltage signal to the electrode structure based on the flatness information to enable the piezoelectric deformable layer to be deformed and thereby to enable the rolling dot pattern at the outer circumferential surface of the first roller to match the surface of the substrate.

In a possible embodiment of the present disclosure, the piezoelectric deformable layer includes a piezoelectric deformable ceramic layer.

In a possible embodiment of the present disclosure, the acquisition unit includes a third control module configured to transmit a second voltage signal to the electrode structure based on the flatness information about the surface of the substrate to enable the piezoelectric deformable layer to be deformed and thereby to restore the rolling dot pattern at the outer circumferential surface of the first roller back to an initial state.

In a possible embodiment of the present disclosure, the lamination device further includes a cleaning member configured to receive the flatness information about the surface of the substrate acquired by the acquisition unit, and in the event that the flatness information is predetermined information, clean the surface of the substrate.

In a possible embodiment of the present disclosure, the lamination device further includes a glue application mechanism configured to apply an adhesive layer onto the surface of the substrate, prior to applying the film layer onto the surface of the substrate.

In another aspect, the present disclosure provides a lamination method for attaching a film layer onto a substrate using the above-mentioned lamination device. The lamination method includes: controlling a deformable layer to be deformed to change a rolling dot pattern at an outer circumferential surface of a first roller and thereby to enable the rolling dot pattern to match a surface of the substrate; applying the film layer onto the surface of the substrate; aligning the substrate with the first roller; and controlling the first roller to roll on the surface of the substrate having the film layer to perform a smoothing and bubble-removing operation.

In a possible embodiment of the present disclosure, the step of controlling the deformable layer to be deformed to change the rolling dot pattern at the outer circumferential surface of the first roller and thereby to enable the rolling dot pattern to match the surface of the substrate includes: controlling an acquisition unit to acquire flatness information about the surface of the substrate and controlling the deformable layer to be deformed based on the flatness information.

In a possible embodiment of the present disclosure, the step of controlling the acquisition unit to acquire the flatness information about the surface of the substrate includes: prior to applying the film layer onto the substrate, controlling a second roller to roll on the surface of the substrate; when the second roller rolls on the surface of the substrate, detecting a pressure between the second roller and the surface of the substrate through a pressure detection film, and generating a detection signal; and generating based on the detection signal the flatness information through a first control module.

In a possible embodiment of the present disclosure, the step of controlling the deformable layer to be deformed based on the flatness information includes: controlling a second control module to transmit a first voltage signal to an electrode structure based on the flatness information; applying the first voltage signal to a piezoelectric deformable layer through the electrode structure; and enabling the piezoelectric deformable layer to be deformed based on the first voltage signal to enable the rolling dot pattern at the outer circumferential surface of the first roller to match the surface of the substrate.

In a possible embodiment of the present disclosure, the lamination method further includes, subsequent to subjecting the substrate to the smoothing and bubble-removing operation: controlling a third control module to transmit a second voltage signal to the electrode structure based on the flatness information about the surface of the substrate to enable the piezoelectric deformable layer to be deformed and thereby to restore the rolling dot pattern at the outer circumferential surface of the first roller to an initial state.

In a possible embodiment of the present disclosure, the lamination method further includes, prior to applying the film layer to the substrate: applying an adhesive layer onto the surface of the substrate.

The present disclosure has the following beneficial effects: according to the lamination device and the lamination method provided by the embodiments of the present disclosure, the deformable layer is arranged on the first roller, and through the deformation of the deformable layer, the rolling dot pattern at the outer circumferential surface of the first roller may match the surface of the substrate, and thus when the first roller rolls on the surface of the substrate having the film layer to perform the smoothing and bubble-removing operation, it is possible to apply an even force to individual regions of the surface of the substrate, thereby reducing the occurrence of the bubbles and improving the lamination effect.

DETAILED DESCRIPTION

The principles and features of the present disclosure will be described hereinafter in conjunction with the drawings and embodiments. The following embodiments are for illustrative purposes only, but shall not be used to limit the scope of the present disclosure.

The surface of a to-be-laminated substrate has non-uniform flatness in individual regions, and when a uniform-pressure roller rolls on the surface of the to-be-laminated substrate to perform a smoothing and bubble-removing operation, bubbles may occur due to the uneven pressure between the uniform-pressure roller and the surface of the substrate. The present disclosure provides a lamination device, so as to reduce the occurrence of the bubbles and improve the lamination effect.

Figure 1:
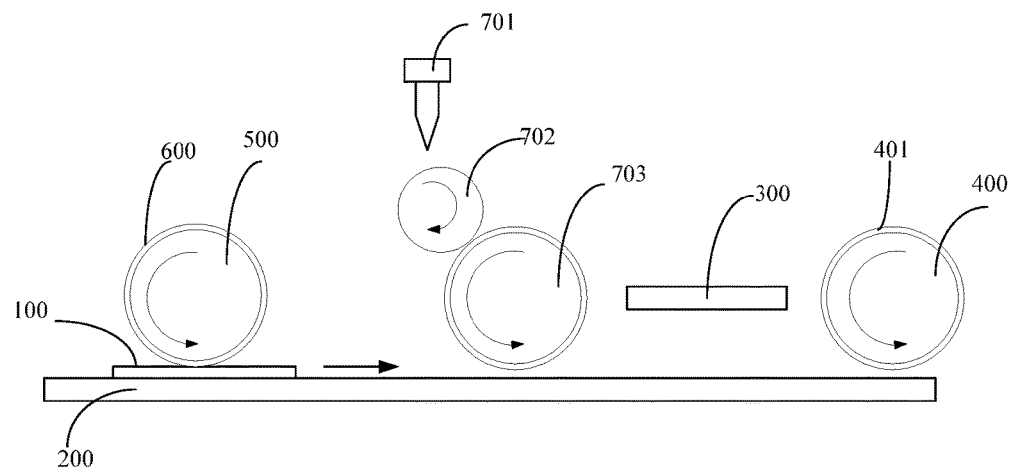
FIG. 1 is a schematic view showing a lamination device according to the embodiments of the present disclosure.
Figure 3:
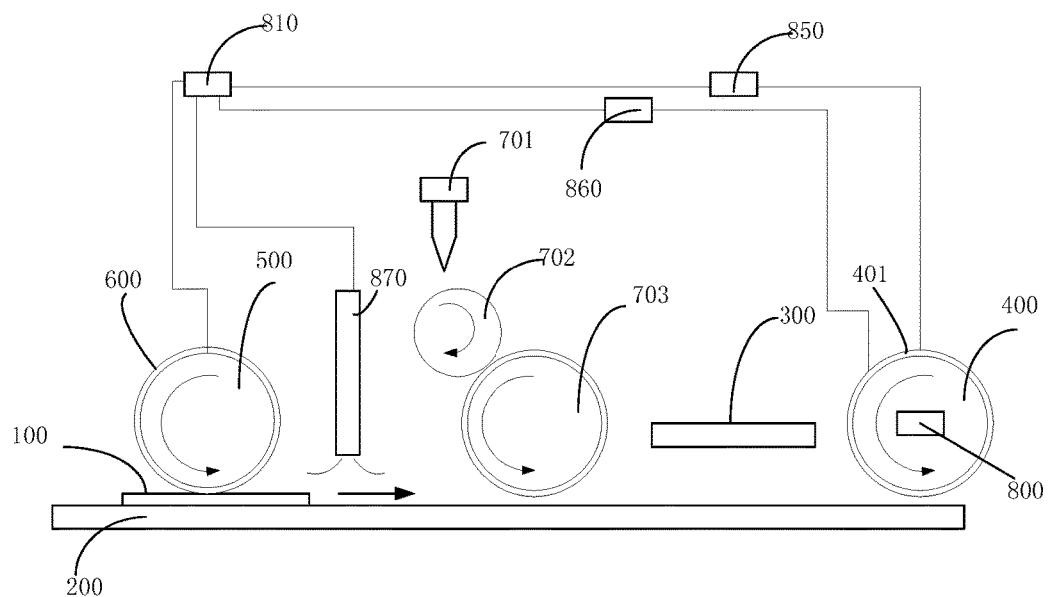
FIG. 3 is another schematic view showing a lamination device according to the embodiments of the present disclosure.

As shown in FIG. 1, the present disclosure provides a lamination device for attaching a film layer onto a substrate. The lamination device includes: a platform 200 configured to carry and deliver a substrate 100; a layer application member 300 configured to apply the film layer onto a surface of the substrate 100; a first roller 400 configured to roll on the substrate 100 having the film layer so as to perform a smoothing and bubble-removing operation; a deformable layer 401 arranged on the first roller 400 and capable of being deformed so as to change a rolling dot pattern at an outer circumferential surface of the first roller 400, thereby to enable the rolling dot pattern to match the surface of the substrate 100; and an alignment mechanism 800 (as shown in FIG. 3) configured to align the substrate 100 with the first roller 400.

According to the lamination device provided by the present disclosure, the deformable layer 401 is arranged on the first roller 400, and through the deformation of the deformable layer 401, the rolling dot pattern at the outer circumferential surface of the first roller 400 may match the surface of the substrate 100. As a result, in the event that the first roller 400 rolls on the surface of the substrate 100 with the film layer so as to perform the smoothing and bubble-removing operation, it is possible to make the rolling dot pattern on the first roller 400 correspond to the surface of the substrate 100 after the substrate 100 is aligned with the first roller 400 so that an even force is applied to the regions at the surface of the substrate 100, thereby preventing the occurrence of the bubbles and improving the lamination effect.

It should be appreciated that, the rolling dot pattern on the first roller 400 matching the surface of the substrate 100 may include the following two scenarios: in the event that the surface of the substrate 100 is provided with a protrusion at a certain region, the deformable layer 401 may be deformed at a position corresponding to this region, so as to enable the rolling dot pattern on the first roller 400 to be depressed at a position corresponding to the protrusion; otherwise, in the event that the surface of the substrate 100 is provided with a depression at a certain region, the deformable layer 401 may be deformed at a position corresponding to this region, so as to enable the rolling dot pattern on the first roller 400 to be protruded at a position corresponding to the depression.

It should be further appreciated that, in the embodiments of the present disclosure, the following ways may be adopted so as to enable the rolling dot pattern on the first roller 400 to match the surface of the substrate 100 by means of the deformable layer 401.

In a possible embodiment of the present disclosure, the deformable layer 401 may be arranged at the outer circumferential surface of the first roller 400 and may be in direct contact with the substrate 100 with the film layer, i.e., a pattern of the deformable layer 401 after the deformation is just the rolling dot pattern on the first roller 400. At this time, the deformable layer 401 may be deformed in such a manner as to be adapted to the surface of the substrate 100, so as to enable the rolling dot pattern on the first roller 400 to match the surface of the substrate 100. In another possible embodiment of the present disclosure, the deformable layer may be covered with a functional layer which may include a protection layer for protecting the deformable layer 401. The protection layer may be made of a flexible material, and capable of being deformed along with the deformation of the deformable layer 401. In other words, a pattern of the protection layer obtained along with the deformation of the deformable layer 401 is just the rolling dot pattern on the first roller 400. In a possible embodiment of the present disclosure, the protection layer may be a nano-rubber adsorption film. In the event that the deformable layer 401 is deformed, the protection layer may be deformed too, so as to enable the rolling dot pattern on the first roller 400 to match the surface of the substrate 100.

In a possible embodiment of the present disclosure, the deformable layer 401 may be deformed under the effect of an external force applied thereto, so as to enable the rolling dot pattern on the first roller 400 to match the surface of the substrate 100. The deformable layer 400 may a plastic deformable layer which is capable of being deformed under the effect of the external force and may maintain this deformed shape after the external force is not applied thereto any more. The plastic deformable layer is configured to generate the plastic deformation due to the pressure between the first roller 400 and the substrate 100 in the event that the first roller 400 rolls on the surface of the substrate 100.

In the above-mentioned technical solution, prior to applying the film layer onto the substrate 100, the first roller 400 may perform a first rolling operation on the surface of the substrate 100, so as to enable the deformable layer 401 on the first roller 400 to be deformed due to the pressure between the first roller 400 and the substrate 100 in such a manner as to match the surface of the substrate 100 and maintain this deformed shape after the rolling operation. In this way, after the film layer is applied onto the substrate 100 and the first roller 400 performs a second rolling operation on the substrate 100 for performing the smoothing and bubble-removing operation, the rolling dot pattern on the first roller 400 may be maintained in a shape matching the surface of the substrate 100. Therefore, an even force is applied to the regions of the substrate 100, thereby reducing the occurrence of the bubbles.

In another possible embodiment of the present disclosure, the deformable layer 401 may also be deformed under the effect of an external signal, which will be described hereinafter in detail.

In the present embodiment, the lamination device further includes an acquisition unit configured to acquire flatness information about the surface of the substrate 100 and control the deformable layer 401 to be deformed based on the flatness information. In the above-mentioned technical solution, by providing the acquisition unit to acquire the flatness information about the surface of the substrate 100 and control the deformable layer 401 to be deformed based on the flatness information, it is possible to further improve the matching accuracy between the pattern at the surface of the uniform-pressure roller and the substrate of the substrate.

In a possible embodiment of the present disclosure, as shown in FIG. 1, the acquisition unit includes: a second roller 500 configured to roll on the surface of the substrate 100 prior to applying the film layer onto the substrate 100; a pressure detection film 600 arranged on an outer circumferential surface of the second roller 500, and configured to detect a pressure between the second roller 500 and the surface of the substrate 100 when the second roller 500 rolls on the surface of the substrate 100, and generate a corresponding detection signal; and a first control module 810 (as shown in FIG. 3) configured to generate the flatness information based on the detection signal.

In the above-mentioned technical solution, prior to applying the film layer onto the substrate 100, the second roller 500 may roll on the surface of the substrate 100. The pressure detection film 600 may detect the pressure between the second roller 500 and the substrate of the substrate 100 and generate the detection signal. The first control module may generate the flatness information based on the detection signal, and the deformable layer 401 may be deformed based on the flatness information, so as to enable the rolling dot pattern on the first roller 400 to match the surface of the substrate 100. Then, the first roller 400 may roll on the substrate 100 with the film layer so as to perform the smoothing and bubble-removing operation. In this way, the rolling dot pattern on the first roller 400 may be maintained in a shape matching the surface of the substrate 100, so an even force is applied to the regions of the substrate 100, thereby reducing the occurrence of the bubbles.

Figure 2:
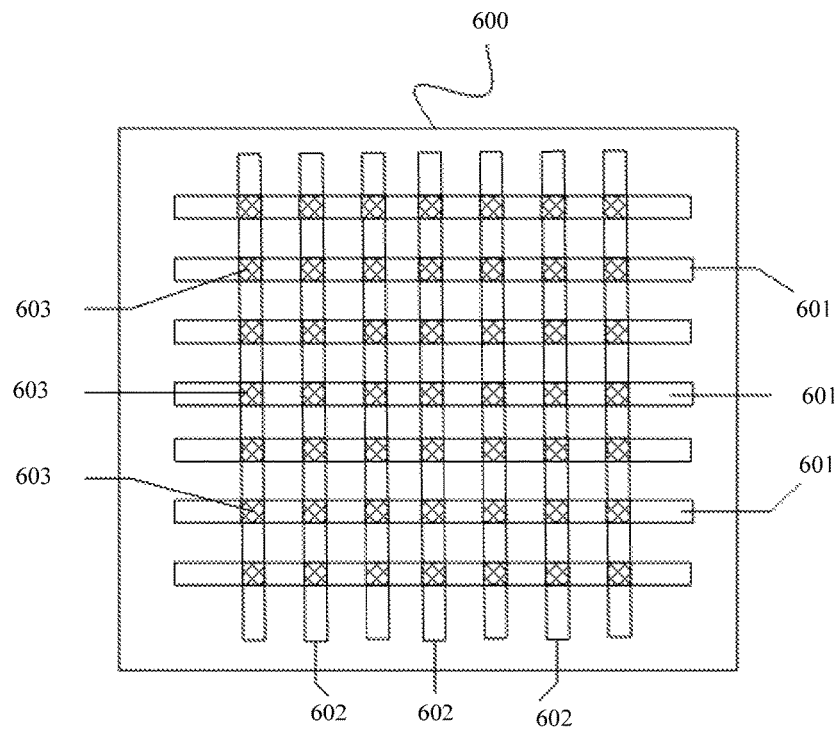
FIG. 2 is a schematic view showing a pressure detection film of a lamination device according to the embodiments of the present disclosure.

In a possible embodiment of the present disclosure, as shown in FIG. 2, the pressure detection film 600 includes: a first electrode 601 arranged at the outer circumferential surface of the second roller 500; a second electrode 602 arranged opposite to the first electrode 601 and overlapping the first electrode 601 at a plurality predetermined regions; an intermediate layer arranged between the first electrode 601 and the second electrode 602; and a plurality of capacitive sensors 603 arranged at the predetermined regions between the first electrode 601 and the second electrode 602. The capacitance sensors 603 are configured to, in the event that the second roller 500 rolls on the surface of the substrate 100, convert the pressure between the second roller 500 and the surface of the substrate 100 at the corresponding predetermined region into a capacitance change value, and generate the corresponding detection signal. The first control module is further configured to generate the flatness information based on the detection signal and the position information about the predetermined region where the capacitive sensor 603 is located.

In the embodiments of the present disclosure, the pressure detection film 600 may acquire the flatness information about the surface of the substrate 100 as follows. In the event that the substrate 100 has non-uniform flatness at different regions of the surface and the second roller 500 rolls on the surface of the substrate 100, uneven pressures may also exist between the pressure detection film 600 and the substrate 100. Therefore, at individual predetermined regions, the first electrode 601 may be separated from the corresponding second electrode 602 by different distances, and the capacitance of the corresponding capacitive sensor 603 may change, resulting in different piezoelectric induction currents output from the capacitive sensors 603. In other words, the capacitive sensors 603 at the predetermined regions may convert the pressure generated in the event that the pressure detection film 600 is in contact with the substrate 100 into a change in the capacitance, and output the piezoelectric induction current. The first control module may determine the flatness information about the surface of the substrate at different regions based on the magnitude of the piezoelectric induction currents from the capacitive sensors 603 and the positions of the capacitive sensors 603 in the pressure detection film 600.

The pressure detection film 600 with the above-mentioned structure has excellent dynamic and static sensing performances. Hence, no matter whether the pressure detection film 600 is in momentary or continuous contact with the substrate 100, it is able to acquire the pressure information in a better manner, thereby ensuring the acquired flatness information about the surface of the substrate 100 having higher accuracy.

In a possible embodiment of the present disclosure, as shown in FIG. 2, the first electrode 601 includes a plurality of first electrode strips arranged circumferentially at intervals around the second roller 500, the second electrode 602 includes a plurality of second electrode strips perpendicularly intersecting the plurality of first electrode strips, and a plurality of regions where the first electrode strips intersect the second electrode strips form the plurality of predetermined regions.

In the embodiments of the present disclosure, for the pressure detection film 600, the first electrode strips of the first electrode 601 are arranged perpendicular to the second electrode strips of the second electrode 602, so as to facilitate the acquisition of the position information about the capacitive sensors 603 and thereby improving the accuracy of the flatness information about the surface of the substrate 100. It should be appreciated that, the arrangement of the first electrode 601 and the second electrode 602 is not limited thereto in other embodiments.

It should be appreciated that, in some other embodiments of the present disclosure, the acquisition unit may also acquire the flatness information about the surface of the substrate 100 in any other ways. For example, a flexible thin-layer sensor, a piece of pressure detection rubber or an electro-rheological fluid sensor may be arranged on the second roller 500 so as to acquire the flatness information about the surface of the substrate 100, and the present disclosure is not limited thereto.

It should be further appreciated that, in a possible embodiment of the present disclosure, the pressure detection film 600 may be covered with a protection layer for protecting the pressure detection film 600, and the protection layer may be a nano-rubber adsorption film.

It should be further appreciated that, in the embodiments of the present disclosure, the second roller 500 and the first roller 400 may be the same roller, i.e., the first roller 400 may be configured to not only perform a first rolling operation on the surface of the substrate 100 so as to acquire the flatness of the surface of the substrate 100, but also performs a second rolling operation on the surface of the substrate 100 so as to perform the smoothing and bubble-removing operation. It should be understood that the second roller 500 and the first roller 400 may also be different rollers.

It should be further appreciated that, in the event that the second roller 500 and the first roller 400 are the same roller, the pressure detection film 600 may cover the deformable layer 401 and be covered with a protection layer. In addition, the first electrode 601 and the second electrode 602 of the pressure detection film 600 may be made of a flexible, conductive material, so as to be deformed along with the deformation of the deformable layer 501. In a possible embodiment of the present disclosure, the first electrode 601 and the second electrode 602 may be made of a carbon nanotube conductive material.

Figure 4:
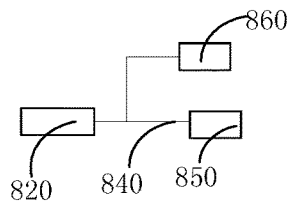
FIG. 4 is a schematic view showing a deformable layer of a lamination device according to the embodiments of the present disclosure.

In a possible embodiment of the present disclosure, as shown in FIG. 4, the deformable layer 401 includes a piezoelectric deformable layer 820 which is deformed under the effect of a voltage applied thereto, and an electrode structure 840 configured to apply a voltage signal to the piezoelectric deformable layer. The acquisition unit includes a second control module 850 (as shown in FIGS. 3-4) configured to transmit a first voltage signal to the electrode structure based on the flatness information, so as to enable the piezoelectric deformable layer 401 to be deformed and thereby to enable the rolling dot pattern at the outer circumferential surface of the first roller 400 to match the surface of the substrate 100.

In the embodiments of the present disclosure, the second control module may determine a voltage for the deformation of the piezoelectric deformable layer based on the flatness information about the surface of the substrate 100 at different regions, and apply the determined voltage to the electrode structure which controls the deformation of the piezoelectric deformable layer, so as to enable the piezoelectric deformable layer to be deformed and thereby to enable the rolling dot pattern to match the surface of the substrate 100. It should be appreciated that, in some other embodiments of the present disclosure, the deformable layer 401 may be implemented in other ways, and the structure of the deformable layer 401 is not limited herein.

In a possible embodiment of the present disclosure, the piezoelectric deformable layer may be a piezoelectric deformable ceramic layer, which may be made of a polycrystal material consisting of irregular aggregates of fine grains and obtained by mixing raw materials of essential components and then granulating, molding and sintering at a high temperature the mixture, e.g., a barium titanate-based compound or a lead zirconate titanate-based compound.

In a possible embodiment of the present disclosure, the acquisition unit may further includes a third control module 860 (as shown in FIGS. 3-4) configured to transmit a second voltage signal to the electrode structure based on the flatness information about the surface of the substrate 100, so as to enable the piezoelectric deformable layer to be deformed and thereby to restore the rolling dot pattern at the outer circumferential surface of the first roller 400 to its initial state. In the above-mentioned technical solution, it is possible to adopt the third control module to control the piezoelectric deformable layer 401 to be deformed based on the flatness information about the surface of the substrate 100 and thereby to restore the rolling dot pattern on the first roller 400 back to its initial state for the subsequent lamination of another substrate 100. To be specific, the third control module may control the piezoelectric deformable layer to generate or eliminate, based on the flatness information about the surface of the substrate 100, the rolling dot pattern corresponding to different regions of the surface of the substrate 100. Different parameters may be set for the piezoelectric deformable layer, so as to enable the piezoelectric deformable layer to generate different rolling dot patterns. In this way, the lamination device may be adapted to various substrates 100, i.e., different parameters may be set for the piezoelectric deformable layer so as to generate different rolling dot patterns for various substrates 100. As compared with the related art where one lamination layer is merely used for one kind of the substrate 100, in the event that different kinds of the substrates 100 need to be laminated, it is unnecessary to replace the lamination layer (i.e., the piezoelectric deformable layer) on the first roller 400 (i.e., the uniform-pressure roller). As a result, it is possible to save the time for replacing the lamination layer, and prevent the lamination layer from being possibly scratched due to the replacement.

In a possible embodiment of the present disclosure, the lamination device may further include a cleaning member 870 (as shown in FIG. 3) configured to receive the flatness information about the surface of the substrate 100 acquired by the acquisition unit, and in the event that the flatness information is preset information, clean the surface of the substrate 100. To be specific, after the pressure detection film 600 has acquired the flatness information about the surface of the substrate 100 at different regions and before the film layer is applied onto the surface of the substrate 100, the surface of the substrate 100 may be cleaned in the event that it is determined based on the flatness information about the surface of the substrate 100 that such foreign matters as debris or small particles occur on the substrate 100, thereby preventing the surface of the first roller 400 or the substrate 100 from being scratched due to the foreign matters on the substrate 100.

In a possible embodiment of the present disclosure, the cleaning member may be a vacuum sucker, which may be opened in the event that it is determined based on the flatness information about the surface of the substrate 100 that such foreign matters as debris or small particles occur on the substrate 100, so as to clean in time the foreign matters attached on the substrate 100.

In a possible embodiment of the present disclosure, the lamination device further includes a glue application mechanism configured to, prior to applying the film layer onto the surface of the substrate 100, apply an adhesive layer onto the surface of the substrate 100.

For some layers (e.g., an AMOLED layer) which are not adhesive, it is necessary to apply the adhesive layer onto the surface of the substrate 100, then apply the film layer thereonto, and then roll on the film layer with the first roller 400 so as to perform the smoothing and bubble-removing operation.

The glue application mechanism may include a glue dispenser 701, a spreader roller 702 and a third roller 703. The glue dispenser 701 is configured to drip an adhesive material onto the surface of the third roller 703 to form the adhesive layer. Next, the adhesive layer may be spread uniformly through the spreader roller 702 (or a scraper). Then, the third roller 703 may roll on the surface of the substrate 100, so as to transfer the adhesive layer on the surface of the third roller 703 onto the surface of the substrate 100. The specific structure of the glue application mechanism is not limited herein.

In a possible embodiment of the present disclosure, prior to applying the adhesive layer onto the surface of the substrate 100, the glue dispenser 701 and the spreader roller 702 (or scraper) may be separated from the third roller 703. In applying the adhesive layer onto the surface of the substrate 100, the glue dispenser 701 and the spreader roller 702 (or scraper) may move close to the third roller 703, so as to uniformly apply the adhesive layer onto the surface of the third roller 703. Then, the third roller 703 may roll on the surface of the substrate 100, so as to transfer the adhesive layer onto the surface of the substrate 100.

It should be appreciated that, in a possible embodiment of the present disclosure, the third roller 703 and the first roller 400 may be the same roller. In other words, the first roller 400 may be used to apply the adhesive layer onto the substrate 100 prior to applying the film layer onto the substrate 100, and roll on the surface of the substrate 100 subsequent to applying the film layer onto the substrate 100 so as to perform the smoothing and bubble-removing operation. Of course, the third roller 703 and the first roller 400 may be different rollers.

A lamination procedure for applying the AMOLED layer onto the substrate 100 through the lamination device provided by the present embodiment will be described hereinafter.

As shown in FIG. 1, the second roller 500 may perform a first rolling operation on the surface of the substrate 100. The pressure detection film 600 may acquire the flatness information about the surface of the substrate 100. The piezoelectric deformable layer 401 on the first roller 400 may be controlled to be deformed based on the flatness information acquired by the pressure detection film 600, so as to enable the rolling dot pattern on the first roller 400 to match the surface of the substrate 100.

Next, the glue dispenser 701 and the scraper (or the spreader roller 702) may move close to the third roller 703, so as to uniformly apply the adhesive layer onto the third roller 703. The third roller 703 may perform a second rolling operation on the surface of the substrate 100, so as to transfer the adhesive layer on the third roller 703 onto the surface of the substrate 100.

Next, the layer application member 300 may apply the AMOLED layer onto the substrate 100 having the adhesive layer.

Finally, the substrate 100 having the film layer may be aligned with the first roller 400. After the rolling dot pattern on the first roller 400 matches with the surface of the substrate 100, the first roller 400 may perform a third rolling operation on the substrate 100, so as to perform the smoothing and bubble-removing operation.

It should be appreciated that, during the lamination, in the event that the first roller 400, the second roller 500 and the third roller 703 may be the same roller, it is possible to align the roller with the substrate 100 through the alignment mechanism during the three rolling operation.

The present disclosure further provides a lamination method for attaching the film layer onto the substrate 100 using the above-mentioned lamination device. The method includes the following steps.

Step S01, control the deformable layer 401 to be deformed, so as to change the rolling dot pattern at the outer circumferential surface of the first roller 400 and thereby to enable the rolling dot pattern to match the surface of the substrate 100.

Step S02, apply the film layer onto the surface of the substrate 100.

Step S03, align the substrate 100 with the first roller 400.

Step S04, control the first roller 400 to roll on the surface of the substrate 100 having the film layer, so as to perform the smoothing and bubble-removing operation.

In a possible embodiment of the present disclosure, Step S01 may include controlling the acquisition unit to acquire the flatness information about the surface of the substrate 100 and control the deformable layer 401 to be deformed based on the flatness information.

In a possible embodiment of the present disclosure, the step of controlling the acquisition unit to acquire the flatness information about the surface of the substrate 100 may include: prior to applying the film layer onto the substrate 100, controlling the second roller 500 to roll on the surface of the substrate 100; in the event that the second roller 500 rolls on the surface of the substrate 100, detecting a pressure between the second roller 500 and the surface of the substrate 100 through the pressure detection film 600, and generating a detection signal; and generating the flatness information through the first control module based on the detection signal.

In a possible embodiment of the present disclosure, the step of controlling the deformable layer 401 to be deformed based on the flatness information may include: controlling the second control module to transmit a first voltage signal to an electrode structure based on the flatness information; applying the first voltage signal to a piezoelectric deformable layer through the electrode structure; and deforming the piezoelectric deformable layer based on the first voltage signal, so as to enable the rolling dot pattern at the outer circumferential surface of the first roller 400 to match the surface of the substrate 100.

In a possible embodiment of the present disclosure, the lamination method may further include, subsequent to subjecting the substrate 100 to the smoothing and bubble-removing operation, controlling the third control module to transmit a second voltage signal to the electrode structure based on the flatness information about the surface of the substrate 100, so as to enable the piezoelectric deformable layer to be deformed and thereby to restore the rolling dot pattern at the outer circumferential surface of the first roller 400 to its initial state.

In a possible embodiment of the present disclosure, the lamination method may further include, prior to applying the film layer to the substrate 100, applying the adhesive layer onto the surface of the substrate 100.

The above are merely the optional embodiments of the present disclosure. It should be understood that a person skilled in the art may make further modifications and improvements without departing from the spirit of the present disclosure, and these modifications and improvements shall also fall within the scope of the present disclosure.

What is claimed is:

1. A lamination device for attaching a film layer onto a substrate, the lamination device comprising:
    a platform configured to carry and deliver the substrate;
    a layer application member configured to apply the film layer onto a surface of the substrate;
    a first roller configured to roll on the substrate, after the film layer has been completely applied to the substrate, to perform a smoothing and bubble-removing operation, the first roller being a component different from the layer application member;
    a deformable layer arranged on the first roller and capable of being deformed to change a rolling dot pattern at an outer circumferential surface of the first roller and thereby to enable the rolling dot pattern to match the surface of the substrate; and
    an alignment mechanism configured to align the substrate with the first roller.

2. The lamination device according to claim 1, further comprising an acquisition unit configured to acquire flatness information about the surface of the substrate and control the deformable layer to be deformed based on the flatness information.

3. The lamination device according to claim 2, wherein the acquisition unit comprises:
    a second roller configured to roll on the surface of the substrate prior to applying the film layer onto the substrate;
    a pressure detection film arranged on an outer circumferential surface of the second roller, and configured to, when the second roller rolls on the surface of the substrate, detect a pressure between the second roller and the surface of the substrate, and generate a corresponding detection signal; and
    a first control module configured to generate the flatness information based on the detection signal.

4. The lamination device according to claim 3, wherein the pressure detection film comprises:
    a first electrode arranged at the outer circumferential surface of the second roller;
    a second electrode arranged opposite to the first electrode and overlapping the first electrode at a plurality of predetermined regions; and
    a plurality of capacitive sensors arranged at the predetermined regions between the first electrode and the second electrode and configured to, when the second roller rolls on the surface of the substrate, convert the pressure between the second roller and the surface of the substrate at the corresponding predetermined region into a capacitance change value, and generate the corresponding detection signal,
    wherein the first control module is further configured to generate the flatness information based on the detection signal and position information about the predetermined region where the capacitive sensor is located.

5. The lamination device according to claim 4, wherein the first electrode comprises a plurality of first electrode strips arranged circumferentially at intervals around the second roller, the second electrode comprises a plurality of second electrode strips perpendicularly intersecting the plurality of first electrode strips, and
    a plurality of regions where the plurality of first electrode strips intersect the plurality of second electrode strips form the plurality of predetermined regions.

6. The lamination device according to claim 2, wherein the deformable layer comprises a piezoelectric deformable layer that is deformed under the effect of an applied voltage, and an electrode structure configured to apply a voltage signal to the piezoelectric deformable layer, and
    the acquisition unit comprises a second control module configured to transmit a first voltage signal to the electrode structure based on the flatness information to enable the piezoelectric deformable layer to be deformed and thereby to enable the rolling dot pattern at the outer circumferential surface of the first roller to match the surface of the substrate.

7. The lamination device according to claim 6, wherein the piezoelectric deformable layer comprises a piezoelectric deformable ceramic layer.

8. The lamination device according to claim 6, wherein the acquisition unit comprises a third control module configured to transmit a second voltage signal to the electrode structure based on the flatness information about the surface of the substrate to enable the piezoelectric deformable layer to be deformed and thereby to restore the rolling dot pattern at the outer circumferential surface of the first roller to an initial state.

9. The lamination device according to claim 2, further comprising a cleaning member configured to receive the flatness information about the surface of the substrate acquired by the acquisition unit, and clean the surface of the substrate in the event the flatness information is predetermined information.

10. The lamination device according to claim 1, further comprising a glue application mechanism configured to, prior to applying the film layer onto the surface of the substrate, apply an adhesive layer onto the surface of the substrate.

11. A lamination method for attaching a film layer onto a substrate using a lamination device, wherein
the lamination device comprises:
a platform configured to carry and deliver the substrate;
a layer application member configured to apply the film layer onto a surface of the substrate;
a first roller configured to roll on the substrate, after the film layer has been completely applied to the substrate, to perform a smoothing and bubble-removing operation, the first roller being a component different from the layer application member;
a deformable layer arranged on the first roller and capable of being deformed to change a rolling dot pattern at an outer circumferential surface of the first roller and thereby to enable the rolling dot pattern to match the surface of the substrate; and
an alignment mechanism configured to align the substrate with the first roller, and
the lamination method comprises:
controlling the deformable layer to be deformed to change the rolling dot pattern at the outer circumferential surface of the first roller and thereby to enable the rolling dot pattern to match the surface of the substrate;
applying the film layer onto the surface of the substrate;
aligning the substrate with the first roller; and
controlling the first roller to roll on the surface of the substrate having the film layer to perform the smoothing and bubble-removing operation.

12. The lamination method according to claim 11, wherein the controlling the deformable layer to be deformed to change the rolling dot pattern at the outer circumferential surface of the first roller and thereby to enable the rolling dot pattern to match the surface of the substrate comprises:
controlling an acquisition unit to acquire flatness information about the surface of the substrate and controlling the deformable layer to be deformed based on the flatness information.

13. The lamination method according to claim 12, wherein the controlling an acquisition unit to acquire flatness information about the surface of the substrate comprises:
controlling a second roller to roll on the surface of the substrate, prior to applying the film layer onto the substrate;
detecting a pressure between the second roller and the surface of the substrate through a pressure detection film and generating a detection signal, when the second roller rolls on the surface of the substrate; and
generating, based on the detection signal, the flatness information through a first control module.

14. The lamination method according to claim 12, wherein the controlling the deformable layer to be deformed based on the flatness information comprises:
controlling a second control module to transmit, based on the flatness information, a first voltage signal to an electrode structure;
applying the first voltage signal to a piezoelectric deformable layer through the electrode structure; and
enabling the piezoelectric deformable layer to be deformed based on the first voltage signal to enable the rolling dot pattern at the outer circumferential surface of the first roller to match the surface of the substrate.

15. The lamination method according to claim 12, further comprising, subsequent to subjecting the substrate to the smoothing and bubble-removing operation:
controlling a third control module to transmit a second voltage signal to the electrode structure based on the flatness information about the surface of the substrate to enable the piezoelectric deformable layer to be deformed and thereby to restore the rolling dot pattern at the outer circumferential surface of the first roller to an initial state.

16. The lamination method according to claim 11, further comprising, prior to applying the film layer to the substrate:
applying an adhesive layer onto the surface of the substrate.

* * * * *